(12) United States Patent
Daniels et al.

(10) Patent No.: US 9,863,032 B2
(45) Date of Patent: Jan. 9, 2018

(54) TECHNIQUES FOR PROCESSING A SUBSTRATE

(71) Applicant: Varian Semiconductor Equipment Associates, Inc., Gloucester, MA (US)

(72) Inventors: Kevin M. Daniels, Lynnfield, MA (US); Russell J. Low, Bellemead, NH (US); Nicholas P. T. Bateman, Reading, MA (US); Benjamin B. Riordon, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 42 days.

(21) Appl. No.: 14/551,264

(22) Filed: Nov. 24, 2014

(65) Prior Publication Data

US 2015/0102237 A1    Apr. 16, 2015

Related U.S. Application Data

(62) Division of application No. 12/756,036, filed on Apr. 7, 2010, now Pat. No. 8,900,982.

(Continued)

(51) Int. Cl.
*H01J 37/08* (2006.01)
*C23C 14/04* (2006.01)
(Continued)

(52) U.S. Cl.
CPC ............ *C23C 14/042* (2013.01); *C23C 14/48* (2013.01); *H01J 37/3171* (2013.01);
(Continued)

(58) Field of Classification Search
None
See application file for complete search history.

(56) References Cited

U.S. PATENT DOCUMENTS

| | | |
|---|---|---|
| 2,591,842 A | 4/1952 | Llewellyn |
| 4,086,102 A | 4/1978 | King |

(Continued)

FOREIGN PATENT DOCUMENTS

| | | |
|---|---|---|
| JP | 63-136618 A | 6/1988 |
| JP | 5-303954 A | 11/1993 |

(Continued)

OTHER PUBLICATIONS

Journal of Vacuum Science and Technology Part B: Microelectronics and Nanometer Structures, vol. 20, No. 3, May 1, 2002, pp. 914-917, "Ion-graphy Impoanter With Stencil Mask", Nishihashi, et al.

(Continued)

*Primary Examiner* — Andrew Smyth
(74) *Attorney, Agent, or Firm* — Nields, Lemack & Frame, LLC

(57) ABSTRACT

Herein, an improved technique for processing a substrate is disclosed. In one particular exemplary embodiment, the technique may be achieved using a mask for processing the substrate. The mask may be incorporated into a substrate processing system such as, for example, an ion implantation system. The mask may comprise one or more first apertures disposed in a first row; and one or more second apertures disposed in a second row, each row extending along a width direction of the mask, wherein the one or more first apertures and the one or more second apertures are non-uniform.

7 Claims, 9 Drawing Sheets

Related U.S. Application Data

(60) Provisional application No. 61/167,550, filed on Apr. 8, 2009.

(51) Int. Cl.
  *H01J 37/317* (2006.01)
  *H01L 21/266* (2006.01)
  *C23C 14/48* (2006.01)

(52) U.S. Cl.
  CPC ........ *H01L 21/266* (2013.01); *H01J 2237/08* (2013.01); *H01J 2237/303* (2013.01); *H01J 2237/31711* (2013.01)

(56) References Cited

U.S. PATENT DOCUMENTS

| | | | |
|---|---|---|---|
| 4,213,053 A * | 7/1980 | Pfeiffer | H01J 37/3007 250/398 |
| 4,751,169 A | 6/1988 | Behringer et al. | |
| 5,036,209 A * | 7/1991 | Kataoka | B82Y 10/00 250/398 |
| 5,051,556 A * | 9/1991 | Sakamoto | B82Y 10/00 219/121.25 |
| 5,369,282 A | 11/1994 | Arai et al. | |
| 5,468,595 A | 11/1995 | Livesay | |
| 5,523,576 A | 6/1996 | Koike et al. | |
| 6,015,976 A | 1/2000 | Hatakeyama et al. | |
| 6,429,440 B1 | 8/2002 | Bleeker | |
| 6,677,598 B1 | 1/2004 | Benveniste | |
| 6,930,316 B2 | 8/2005 | Nishihashi et al. | |
| 7,179,569 B2 * | 2/2007 | Suguro | B82Y 10/00 430/5 |
| 7,242,014 B2 | 7/2007 | Ota et al. | |
| 7,282,725 B2 * | 10/2007 | Shibata | H01J 37/3171 250/396 R |
| 7,394,070 B2 | 7/2008 | Nozoe et al. | |
| 7,446,326 B2 | 11/2008 | Chaney et al. | |
| 7,727,866 B2 | 6/2010 | Bateman et al. | |
| 7,799,517 B1 | 9/2010 | Capodieci | |
| 7,816,239 B2 | 10/2010 | Blake et al. | |
| 7,820,460 B2 | 10/2010 | Sullivan et al. | |
| 7,888,249 B2 | 2/2011 | Bateman et al. | |
| 8,900,982 B2 | 12/2014 | Daniels et al. | |
| 2002/0064714 A1 | 5/2002 | Okamoto | |
| 2002/0066872 A1 * | 6/2002 | Nishihashi | H01J 37/3171 250/492.21 |
| 2002/0081502 A1 | 6/2002 | Hayano et al. | |
| 2003/0089863 A1 | 5/2003 | Hirayanagi | |
| 2004/0043310 A1 | 3/2004 | Takeishi et al. | |
| 2004/0052942 A1 * | 3/2004 | Bijkerk | C23C 14/044 427/248.1 |
| 2004/0094725 A1 | 5/2004 | Gierak et al. | |
| 2004/0155204 A1 | 8/2004 | Kumano et al. | |
| 2004/0195524 A1 | 10/2004 | Yamauchi | |
| 2004/0209174 A1 | 10/2004 | Moriya et al. | |
| 2004/0256555 A1 * | 12/2004 | Shichi | H01J 37/3056 250/307 |
| 2005/0003305 A1 | 1/2005 | Hashimoto et al. | |
| 2005/0170268 A1 | 8/2005 | Shibata | |
| 2006/0118735 A1 | 6/2006 | Kim et al. | |
| 2006/0128156 A1 | 6/2006 | Liu et al. | |
| 2006/0228634 A1 | 10/2006 | Bret et al. | |
| 2006/0258128 A1 * | 11/2006 | Nunan | H01J 37/09 438/510 |
| 2007/0114463 A1 | 5/2007 | Nakasugi et al. | |
| 2007/0187620 A1 | 8/2007 | Jung et al. | |
| 2007/0284538 A1 | 12/2007 | Zani et al. | |
| 2008/0128636 A1 * | 6/2008 | Koster | G01N 1/2273 250/492.1 |
| 2008/0128638 A1 | 6/2008 | Doering et al. | |
| 2008/0149856 A1 * | 6/2008 | Low | H01J 37/09 250/492.21 |
| 2009/0068783 A1 | 3/2009 | Borden | |
| 2009/0142875 A1 | 6/2009 | Borden et al. | |
| 2009/0227094 A1 | 9/2009 | Bateman et al. | |
| 2009/0227095 A1 | 9/2009 | Bateman et al. | |
| 2009/0308439 A1 | 12/2009 | Adibi et al. | |
| 2010/0062589 A1 | 3/2010 | Anella et al. | |
| 2010/0124799 A1 | 5/2010 | Blake et al. | |
| 2011/0089342 A1 | 4/2011 | Daniels et al. | |
| 2011/0089343 A1 | 4/2011 | Daniels et al. | |
| 2011/0092059 A1 | 4/2011 | Daniels et al. | |

FOREIGN PATENT DOCUMENTS

| | | |
|---|---|---|
| JP | 8-213339 A | 8/1996 |
| JP | 8-298247 A | 11/1996 |
| JP | 08298247 A * | 11/1996 |
| JP | 8-318387 A | 12/1996 |
| JP | 2001-229872 A | 8/2001 |
| JP | 2004-519070 A | 6/2004 |
| JP | 2004-348118 A | 12/2004 |
| JP | 2007-163640 A | 6/2007 |
| JP | 2007-273368 A | 10/2007 |
| JP | 2007-287973 A | 11/2007 |
| KR | 10-2004-0058898 A | 7/2004 |
| KR | 10-2008-0062737 A | 7/2008 |
| WO | 2010/065204 A2 | 6/2010 |
| WO | 2010/120765 A2 | 10/2010 |

OTHER PUBLICATIONS

IEEE Transactions on Semiconductor Manufacturing, vol. 15, No. 2, May 1, 2002, pp. 183-188, "Stencil Mask Ion Implantation Technology", Shibata, et al.

Junction Technology, Nov. 29, 2001, pp. 11-14, "Stencil Mask Ion Implantation Technology for Sub 100-nm Technology Node", Shibata, et al.

International Search Report dated Nov. 26, 2010 in corresponding PCT application No. PCT/US2010/030395.

Written Opinion of the International Searching Authority dated Nov. 26, 2010 in corresponding PCT application No. PCT/US2010/030395.

International Preliminary Report on Patentability dated Oct. 11, 2011 corresponding PCT application No. PCT/US2010/030395.

* cited by examiner

TECHNIQUES FOR PROCESSING A SUBSTRATE

PRIORITY

This application is a divisional of U.S. patent application Ser. No. 12/756,036 filed Apr. 7, 2010, which claims priority to U.S. Provisional Patent Application Ser. No. 61/167,550, filed on Apr. 8, 2009, entitled "Apparatus to Perform Blanket and Patterned Implant." The disclosures of which are incorporated herein by reference.

FIELD

The present disclosure relates to a technique for processing a substrate, more particularly to a technique for introducing dopants or impurities into a substrate.

BACKGROUND

In manufacturing electronic devices, dopants or impurities are introduced into a substrate to alter the substrate's original mechanical, optical, or electrical property. In manufacturing memory devices, boron ions may be introduced into a silicon substrate. As boron ions and silicon atoms in the crystal lattice have different electrical property, introduction of sufficient amount of boron ions may alter the electrical property of the silicon substrate.

Ion implantation technique may be used to introduce the dopants. In this technique, feed material containing desired species is ionized. Thereafter, the ions of the feed material are directed, in a form of an ion beam having desired energy, toward the substrate and thereafter implanted. If the ions are of different species, the ion may alter the property of the substrate.

A solar cell, another silicon substrate based device, may also be manufactured by introducing ions or dopants into the silicon substrate. In the past, the dopants have been introduced via diffusion process where dopant containing glass or paste is disposed on the silicon substrate. Thereafter, the substrate is heated, and the dopants in the glass or past are diffused into the substrate via thermal diffusion.

Although the diffusion process may be cost effective, the process has many drawbacks. In some solar cells, it is desirable to perform selective doping to introduce dopants to only selected region of the substrate. However, the diffusion process is difficult to control, and selective doping via diffusion may be difficult to achieve. The process may result in imprecise doping or formation of non-uniform doped regions. In addition, voids or air bubbles, or other contaminants may be introduced into the substrate along with the dopants during the diffusion process.

To address such drawbacks, doping via ion implantation process has been proposed. In the proposed process, the substrate is coated with photo-resist layer, and lithographic process is performed to expose portions of the substrate. Thereafter, the ion implantation is performed, and dopants are implanted into the exposed portions. The process, although achieves precise selective doping, is not inexpensive. Additional steps and time to coat, pattern, and remove the photo-resist, each of which adds costs to the manufacturing process, are required. The steps may be more complicated if the regions to be exposed are extremely small.

Any added cost in manufacturing the solar cell would decrease the solar cell's ability to generate low cost energy. Meanwhile, any reduced cost in manufacturing high-performance solar cells with high efficiency would have a positive impact on the implementation of solar cells worldwide. This will enable the wider availability and adoption of clean energy technology.

As such, a new technique is needed.

SUMMARY OF THE DISCLOSURE

An improved technique for processing a substrate is disclosed. In one particular exemplary embodiment, the technique may be realized with a mask for processing a substrate, the mask comprising: one or more first apertures disposed in a first row; and one or more second apertures disposed in a second row, each row extending along a width direction of the mask, wherein the one or more first apertures and the one or more second apertures are non-uniform.

In accordance with other aspects of this particular exemplary embodiment, the one or more first apertures and the one or more second apertures may have different sizes.

In accordance with additional aspects of this particular exemplary embodiment, the one or more first apertures and the one or more second apertures may have non-uniform alignment along a height direction of the mask.

In accordance with further aspects of this particular exemplary embodiment, the one or more first apertures and the one or more second apertures may be without an overlapping region along the height direction.

In accordance with other aspects of this particular exemplary embodiment, the one or more first apertures and the one or more second apertures may overlap along the height direction to define an overlapping region.

In accordance with additional aspects of this particular exemplary embodiment, the mask may comprise two or more first apertures in the first row and two or more second apertures in the second row, wherein the two or more first apertures in the first row are aligned with one another along a width direction of the mask.

In accordance with further aspects of this particular exemplary embodiment, the two or more second apertures in the second row may be aligned with one another along the width direction of the mask.

In accordance with additional aspects of this particular exemplary embodiment, each of the two or more first apertures and each of the two or more second apertures are in a non-aligned relationship with one another along the height direction.

In accordance with other aspects of this particular exemplary embodiment, the mask may further comprise one or more third apertures disposed in a third row, where the one or more second apertures and the one or more third apertures are in a non-aligned relationship with one another along a height direction of the mask.

In accordance with another exemplary embodiment, the technique may be realized with an apparatus for processing a substrate, the apparatus may comprise: an ion source for generation an ion beam comprising a plurality of ions of desired species, the ion beam directed toward the substrate; a mask disposed between the ion source and the substrate, the mask comprising: one or more first apertures disposed in a first row; and one or more second apertures disposed in a second row, each row extending along a width direction of the mask, wherein the one or more first apertures and the one or more second apertures are non-uniform.

In accordance with further aspects of this particular exemplary embodiment, the one or more first apertures and the one or more second apertures may have different sizes.

In accordance with additional aspects of this particular exemplary embodiment, the one or more first apertures and the one or more second apertures may have non-uniform alignment along a height direction of the mask.

In accordance with further aspects of this particular exemplary embodiment, the one or more first apertures and the one or more second apertures may overlap along the height direction to define an overlapping region.

In accordance with other aspects of this particular exemplary embodiment, the one or more first apertures and the one or more second apertures may be without an overlapping region along the height direction.

In accordance with further aspects of this particular exemplary embodiment, the mask may further comprise: one or more third apertures disposed in a third row, where the one or more second apertures and the one or more third apertures are in a non-aligned relationship with one another along a height direction of the mask.

In accordance with another particular exemplary embodiment, the technique may be realized as a method for processing a substrate. The method may comprise: disposing a mask between an ion source and the substrate, the mask comprising one or more first apertures disposed in a first row, one or more second apertures disposed in a second row, and one or more third apertures disposed in a third row, each row extending along a width direction of the mask; directing an ion beam toward an upper part of the mask so as to overlap a first part of the ion beam with at least a portion of the one or more first apertures and at least a portion of the one or more second apertures; and translating at least one of the mask and the substrate relative to the other one of the mask and the substrate.

In accordance with additional aspects of this particular exemplary embodiment, the method may further comprise: fixedly positioning the ion beam to the mask.

In accordance with additional aspects of this particular exemplary embodiment, the method may further comprise: directing the ion beam toward a lower part of the mask so as to overlap the ion beam with at least a portion of the one or more second apertures and at least a portion of the one or more third apertures.

In accordance with further aspects of this particular exemplary embodiment, the one or more first apertures and the one or more second apertures may have non-uniform alignment along a height direction of the mask.

In accordance with additional aspects of this particular exemplary embodiment, the one or more first apertures and the one or more second apertures may overlap along the height direction to define an overlapping region.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art will recognize additional implementations, modifications, and embodiments, as well as other fields of use, which are within the scope of the present disclosure as described herein, and with respect to which the present disclosure may be of significant utility.

DETAILED DESCRIPTION

Herein several embodiments of techniques for processing a substrate are introduced. For purposes of clarity and simplicity, the embodiments may focus on the technique for introducing dopants or impurities into a substrate. For example, the techniques described herein may be used to form regions containing different doses or levels of impurities and/or regions containing different type of impurities or dopants. Although the present disclosure focuses on particular techniques, the disclosure is not limited thereto.

In the present disclosure, the embodiments are described in context to a ribbon beam, beam-line ion implantation system. Although not discussed in detail, other types of ion implantation systems, including a scan beam ion implantation systems using a spot or focused ion beam, are not precluded. In addition, other types of substrate processing systems including, for example, plasma assisted doping (PLAD) or plasma immersion ion implantation (PIII) systems may be equally applicable.

The substrates disclosed in the embodiments may be silicon based substrates for manufacturing solar cells. While silicon based substrate is mainly discussed, the present disclosure may be equally applicable to substrates containing other materials. For example, the substrates containing cadmium telluride (CdTe), copper indium gallium selenide (CIGS), or other materials may also be applicable. In addition, other, non-solar cell substrates may also be applicable to the present disclosure. Metallic substrates, other semiconducting substrates, and insulating substrates for manufacturing other mechanical, electronic (e.g. memory devices), or optical (e.g. light emitting diodes) devices, or other devices may be equally applicable.

Figure 1:
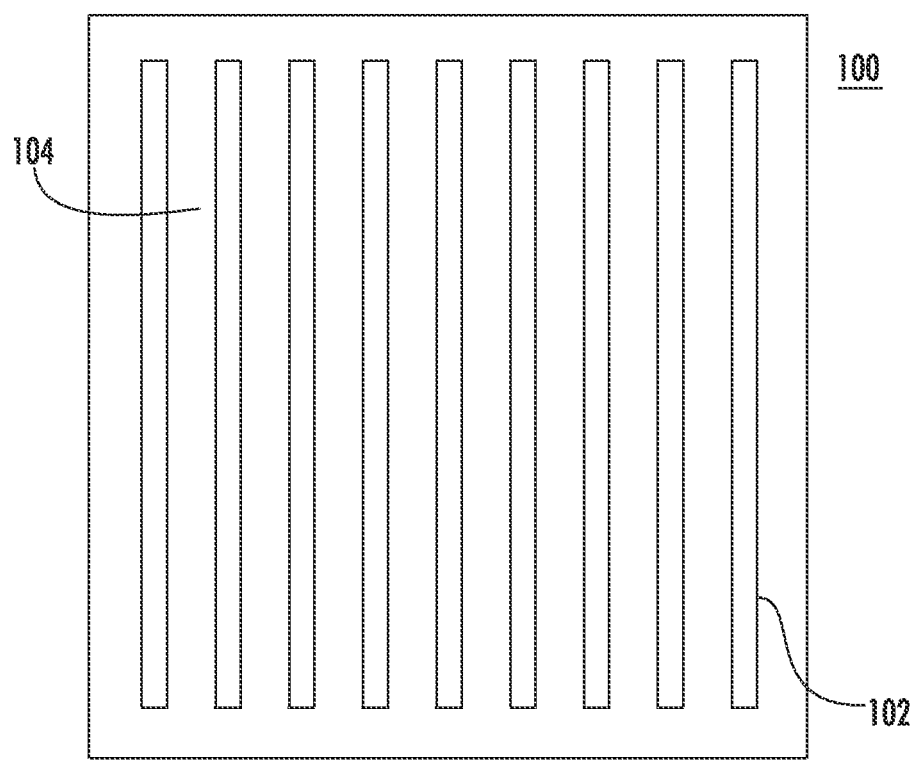
FIG. 1 illustrates a substrate that may be achieved using the technique described in the present disclosure.

Referring to FIG. 1, there is shown an exemplary substrate 100 manufactured using the techniques of the present disclosure. In the present embodiment, a solar cell substrate 100 is shown. On one side, the substrate 100 may include one or more contact regions 102, on each of which metal contact (not shown) may be formed. The contact regions 102 may be formed by introducing a predetermined dose of desired dopants into the regions 102. If the substrate 100 includes two or more contact regions 102, the contact regions 102 may be spaced apart from one another by a spacer region 104. In some embodiments, the substrate 100 may also comprise one or more spacer regions 104, and each spacer region 104 may also be introduced with dopants or impurities. In the present embodiment, the dopant species introduced into the contact regions 102 and the spacer regions 104 may be identical. However, the contact regions 102 may have higher dopant dose than the spacer region 104. If the substrate is a solar cell, this pattern of including heavily doped contact regions 102 and lightly doped spacer regions 104 on the front side of the substrate 100 may be referred to as a selective emitter design. The heavily doped contact regions 102 may enable better interface between the contact regions 101 and the metal contacts. In addition, higher dopant dose may enable higher electrical conductivity in the contact region 102. Although not preferred, the contact regions 102 and the spacer regions 104, in other embodiments, may be introduced with different dopant species. For example, one of the contact region 102 and the spacer region 104 may be introduced with p-type dopants, whereas the other one of the contact region 102 and the spacer region 104 is introduced with n-type dopants. In another example, the contact region 102 and the spacer region 104 may be introduced with same type dopants, but different species. In addition, the dose of the dopants in the contact regions 102 may also be greater than that in the spacer region 104. Alternatively, the dose in the contact regions 102 may be equal to or less than that in the spacer region 104.

Figure 2:
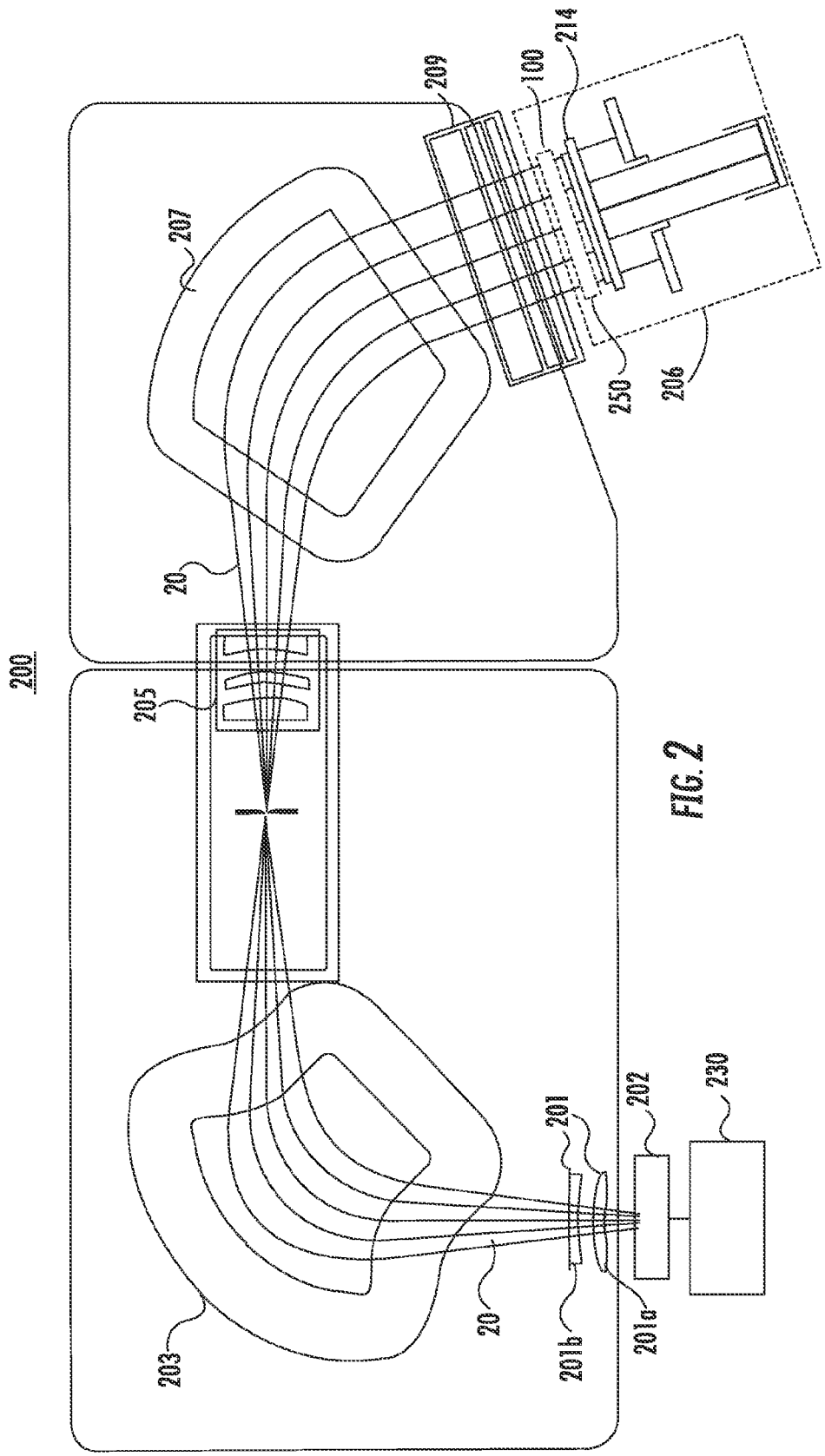
FIG. 2 illustrates an exemplary beam-line ion implantation system for processing a substrate according to one embodiment of the present disclosure.

Referring to FIG. 2, there is shown an exemplary system 200 for processing a substrate according to one embodiment of the present disclosure. In the present embodiment, the system 200 may be used to manufacture a solar cell substrate with selective emitter design shown in FIG. 1. As illustrated in FIG. 2, the system 200 may be a beam-line ion implantation system, where dopants, in the form of ions, may be introduced into the substrate 100.

The ion implantation system 200 of the present embodiment may include an ion source 202 coupled to a gas box 230 containing feed gas of desired dopant species. The feed gas from the gas box 230 is supplied to the ion source 202 and, thereafter, ionized. This feed gas may contain dopant species with one or more elements from Group I and 3A-8A. For example, the feed gas may contain hydrogen (H), helium (He) or other rare gases, oxygen (O), nitrogen (N), arsenic (As), boron (B), phosphorus (P), antimony (Sb), gallium (Ga), indium (In), or other gases. In addition, the feed gas may contain carborane $C_2B_{10}H_{12}$ or another molecular compound. After the feed gas is ionized, the ions 20 in the ion source 202 are extracted by an extraction electrode 201 that includes a suppression electrode 201a and a ground electrode 201b. A power supply (not shown) may be coupled to the extraction electrode 201 and may provide an adjustable voltage.

The ion implantation system 200 may also comprise optional beam-line components. The beam-line components may be optional as systems in other embodiments may omit the beam-line components. If included, the optional beam-line components may include at least one of a mass analyzer 203, an angle corrector magnet 207, and first and second acceleration/deceleration stages 205 and 209.

The mass analyzer 203 may deflect the ions based on their mass. Ions having desired mass may be deflected sufficiently to pass through the exit aperture of the mass analyzer 203 and travel further downstream of the system 200. Meanwhile, ions having undesired mass may be deflected insufficiently or excessively, and the ions may be directed to the walls of the mass analyzer 203. The angle corrector magnet 207, meanwhile, may collimate the ions 20 traveling in a diverging path to a substantially parallel path. In the present embodiment, diverging ion beam 20 may be collimated into a substantially parallel, ribbon shaped ion beam 20. If included, the first and second acceleration/deceleration stages 205 and 207 may accelerate or decelerate the ions in the ion beam 20 traveling along the ion beam path.

The ion beam 20 traveling along the ion beam path may be directed toward the end station 206. In the end station 206, one or more substrates 100 may be positioned in the ion beam path such that the ions in the ion beam 20 may be implanted into the substrate 100. To control the implantation process, the end station 206 may contain various components. For example, the end station 206 may contain a platen 214 which may support the one or more substrates 100. The platen 214, in addition to supporting the substrate 100, may also control, for example, the temperature of the substrate 100 to provide hot or cold ion implantation. To provide the cold ion implantation, the platen 214 may maintain the substrate 100 at a temperature less than the room temperature, preferably less than 273° K. To provide hot ion implantation, the platen 214 may maintain the substrate 100 at a temperature above the room temperature, preferably greater than 293° K. In addition to the platen 214, the ion implantation system 200 of the present disclosure may contain chilling and/or heating station (not shown) where the substrate 100 may be chilled or heated prior to ion implantation or after the ion implantation.

The end station 206 may also contain a scanner (not shown), for example, a roplat, which may position the substrate 100 in the path of the ion beam 20. The scanner may also translate/rotate the substrate 100 to a desired position and orientation relative to the ion beam 20. In one embodiment, the substrate 100 may be oriented at substantially perpendicular to the ion beam path such that the ions are implanted at substantially 0° incident or implant angle. In another embodiment, the substrate may be non-perpendicular to the ion beam 20 to provide non-zero incident or implant angle. In one embodiment, the implant angle may remain constant throughout the implantation process. In another embodiment, the implant angle may be varied during the implantation process. In the present disclosure, the substrate 100 may also be translated, at a desired rate, so as to control the dose of the implanted ions. To ensure proper dose, the end station 306 also may include a dose measuring system.

Between the ion source 202 and the substrate 100, one or more masks 250 may be located. In the present disclosure, the mask 250 may include one or more fingers to block the ions 20 from reaching the substrate 100. The mask 250 may also include one or more apertures through which ions 20 may pass and be implanted into the substrate 100. The mask 250 may be supported by various components of the system 200 including the wall of the end station 206. Proper orientation or position of the mask 250 relative to the ion beam 20 and/or the substrate 100 may be provided by various components supporting the mask 250. For example, an actuator (not shown) may be coupled to the mask 250 to translate, rotate, or tilt the mask 250 relative to the substrate 100 and/or the ion beam 20. To prevent the temperature of the mask 250 from rising excessively, cooling of the mask 250 may also be provided.

Figure 3:
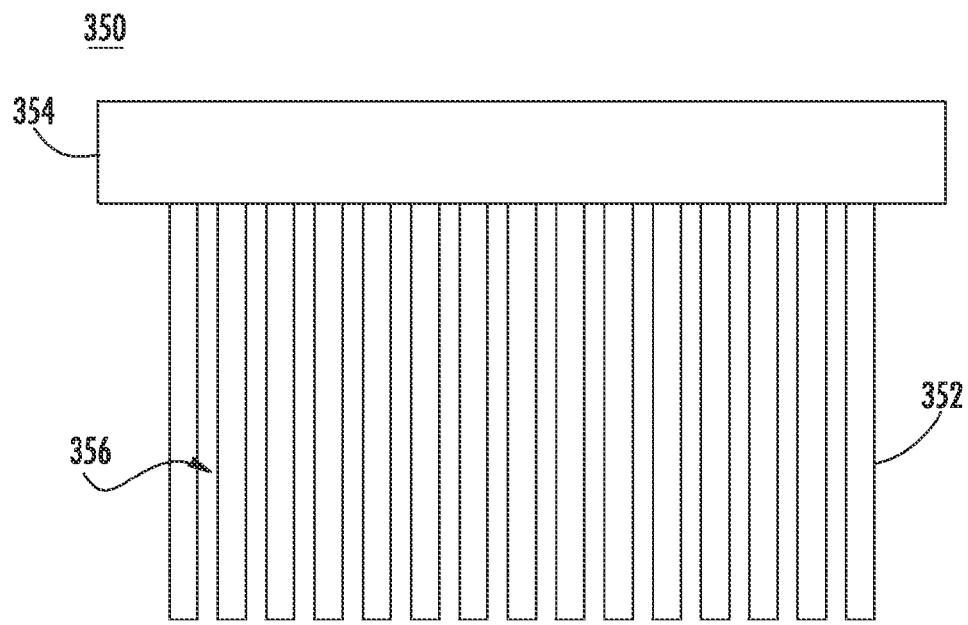
FIG. 3 illustrates an exemplary mask for processing a substrate according to one embodiment of the present disclosure.

Referring to FIG. 3, there is shown an exemplary mask 350 according to one embodiment of the present disclosure. In the present embodiment, the mask 350 may comprise at least one finger 352. The mask 350 may optionally contain a base 354, and the finger 352 may be supported by the base 354. If the mask 350 does not contain the base 354, the mask 350 may be one or more fingers 352 that are supported and/or held together. If the mask 350 comprises two or more fingers 352, the fingers 352 may be spaced apart from one another to define a gap or aperture 356. In one embodiment, the mask 350 may have a plurality of fingers 352 to define one or more gaps or apertures, and the fingers 352 may have uniform shape and size. In addition, the fingers 352 may be configured such that the gaps or apertures 356 have uniform shape and size. In another embodiment, the mask 350 may have 61 fingers 352, and the fingers 352 are configured to form 60 uniform and rectangular apertures 356. However, those of ordinary skill in the art will recognize that the mask 356 may have any number of fingers 352 and apertures 356. In addition, the apertures 356 may have various shapes and sizes, uniform or non-uniform.

The mask 350 may be made from various materials. Preferably, the mask is made from an inert material capable of withstanding the reactive condition of ion implantation. Examples of the material contained in the mask 350 may include quartz, graphite, sapphire, silicon (Si), SiC, and SiN. Other examples of the materials may also be included in the mask 350. Examples of other materials may include material containing dopant species.

Figure 4:
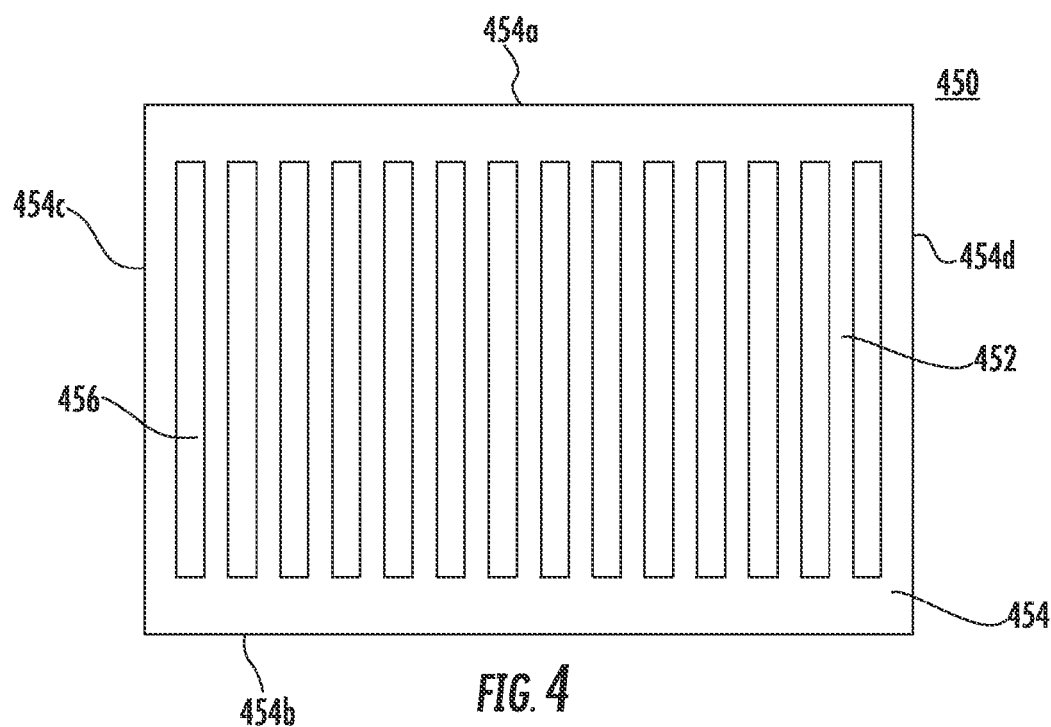
FIG. 4 illustrates another exemplary mask for processing a substrate according to another embodiment of the present disclosure.

Referring to FIG. 4, there is shown another exemplary mask 450 according to another embodiment of the present disclosure. In the present embodiment, the mask 450 may comprise at least one finger 452. The mask 450 may also comprise first and second bases 454a supporting the finger 452, disposed at opposite sides of the mask 450. If desired, the mask 450 may also include third and fourth bases 454c and 454d disposed next to the fingers, at opposite sides of the mask 450. Alternatively, the third and fourth bases 454c and 454d may be replaced with additional fingers 452. If the mask 450 comprises two or more fingers 452, the fingers 452 may be spaced apart from one another to define one or more gaps or apertures 456. In one embodiment, the mask 450 may have a plurality of fingers 452, and the fingers 452 may have uniform shape and size. In addition, the fingers 452 may be configured such that the apertures 456 have uniform shape and size. However, those of ordinary skill in the art will recognize that the mask 456 may have any number of fingers 452 and apertures 456. In addition, the apertures 456 may have various shapes and sizes, uniform or non-uniform.

Similar to the mask 350 of the earlier embodiment shown in FIG. 3, the mask 450 may include various materials. For the purposes of clarity and simplicity, the description of the materials will be omitted.

Figure 5A:
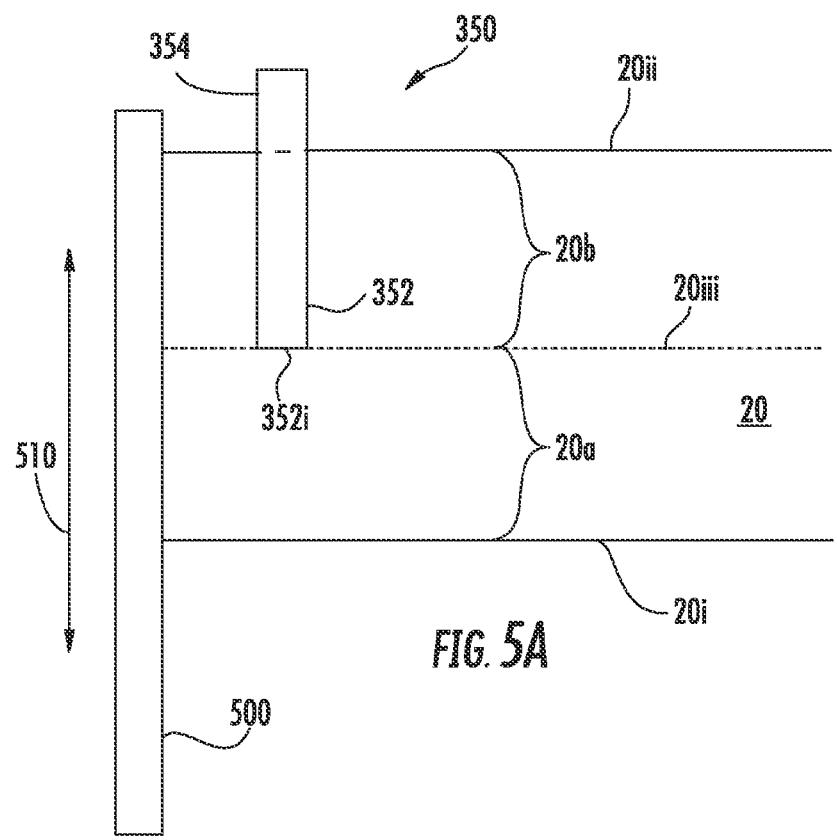
FIGS. 5a and 5b illustrate an exemplary technique for processing a substrate according to one embodiment of the present disclosure.
Figure 5B:
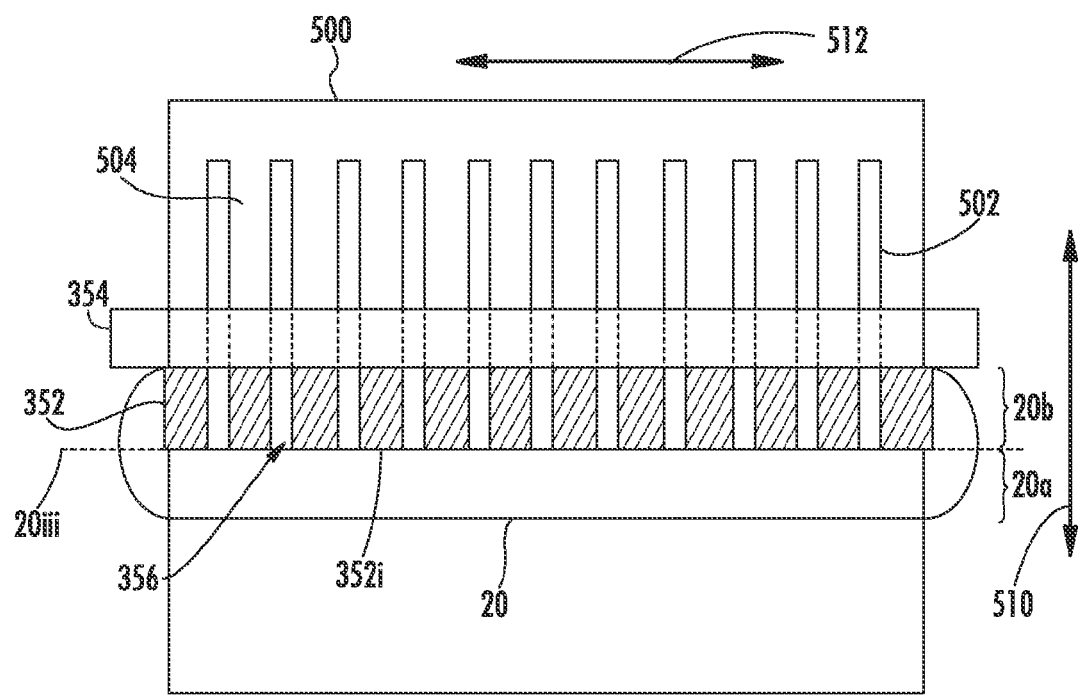

Referring to FIGS. 5a and 5b, there is shown an exemplary technique for processing a substrate according to one embodiment of the present disclosure. The figures are not necessarily drawn to scale. For the purposes of clarity and simplicity, the technique is described using the beam line ion implantation system 200 shown in FIG. 2 and the mask 350 shown in FIG. 3. However, other systems, including the scan beam ion implantation system using spot or focused ion beam, may be used. In addition, other masks, including the mask 450 shown in FIG. 4, may also be used. For purpose of clarity and simplicity, the present technique may be described in context of beam height. Those of ordinary skill in the art will recognize that for the ribbon beam ion implanter, the beam height may refer to the actual height of the ribbon beam. With respect to the scan beam ion implanter using a spot or focused beam, the term may refer to the height of an area by which the spot beam is scanned to achieve the effect similar to that of the ribbon beam ion implanter.

In the present embodiment, a substrate 500 and the mask 350 may be disposed in the ion implantation system 200. As illustrated in FIGS. 5a and 5b, the fingers 352 of the mask 350 may be dimensioned or positioned such that they do not extend through the entire height of the substrate 500, along the height direction shown by arrow 510. The fingers 352 may also be dimensioned or positioned such that they do not extend through the entire height of the ion beam 20. In the present embodiment, the fingers 352 of the mask 350 may extend through about 50% of the height of the ion beam 20. With the fingers 352 extending through less than the entire height, the ion beam 20, when directed toward the substrate 500, may be divided into multiple parts. For example, the ion beam 20 may comprise a first part 20a extending from the first edge 20i of the ion beam 20 to an imaginary reference line 20iii. The ion beam 20 may also comprise a second part 20b extending from the second edge 20ii of the ion beam 20 to the reference line 20iii. The reference line 20iii may be defined by an end of the fingers 352i.

If the fingers 352 extend through about 50% of the height of the ion beam 20, the heights of the first and second parts 20a and 20b of the ion beam 20 may be substantially equal. The ions in the first part of the ion beam 20a may be implanted directly into the substrate 500 to perform the blanket ion implantation. Meanwhile, a portion of the ions in the second part 20b are implanted into the substrate 500 via the apertures 356 to perform the selective ion implantation.

Each of the ion beam 20, the mask 350, and the substrate 500 may have independent rotational and translational freedom, and the ion beam 20, the mask 350, and the substrate 500 may tilt, rotate, and/or translate jointly or independently. In the present embodiment, the mask 350 may be fixedly positioned relative to the ion beam 20. Meanwhile, the substrate 500 may translate relative to the ion beam 20 and/or the mask 352, along the height direction shown by arrow 510. Although not discussed in detail, the substrate 500, in other embodiment, may also translate relative to the ion beam 20 and/or the mask 352, along a direction shown by arrow 512. As the substrate 500 translates along the height direction 510, first and second regions 502 and 504 containing dopants may be formed. The first region 502 may be a highly doped region as the dopants from the first and second part of the ion beam 20a and 20b are implanted. Meanwhile, the second region 504 may be a lightly doped region as the dopants or ions from the first part of the ion beam 20a are implanted. Comparing the substrate 500 of the present embodiment with the substrate 100 shown in FIG. 1, the highly doped first region 502 may correspond to the contact region 102, whereas the lightly doped second region 504 may correspond to the spacer region 104. In other embodiments where the contact region 104 has less dopant dose than the spacer region 104, the highly doped first region 502 may correspond to the spacer region 104, whereas the lightly doped second region 504 may correspond to the contact region 104.

Depending on the height of the fingers 352 and the ion beam 20, the dopant dose or level in the first and second regions 502 and 504 may be adjusted. In the present embodiment, the height of the fingers 352 may be about 50% of the height of the ion beam 20. As a result, the first and second part of the ion beam 20a and 20b resulting from the fingers 352 may have equal height. If the amount of ions in the ion beam 20 is substantially uniform along the height direction 510, and if the rate by which the substrate 500 translates is constant, the dopant dose in the first region 502 may be about twice that in the second region 504. For example, the dopant dose in the first region 502 may be about $2E15/cm^2$, whereas the dopant dose in the second regions 504 having $1E15/cm^2$ dopant dose. In another embodiment, the height of the fingers 352 may be about 33% (one third) of the height of the ion beam 20. In that embodiment, the height of the first part of the ion beam 20a may be about 50% greater than that of the second part 20b. After the ion implantation, the amount of the dopants in the first region 502 may be about 50% greater than the amount of the dopants in the second region 504. As such, the ratio of the dopant dose in the first and second regions 502 and 504 may be approximately 3:2.

In addition, to the controlling the dopant dose, the height of the finger 352 may be adjusted to provide the ion beam uniformity tuning. For example, the fingers 352 of the mask 350 may be adjusted in length to achieve a 2× uniform implant.

Using the technique of the present disclosure, a substrate having two regions with different dopant doses may be manufactured. Unlike the conventional technique, the technique of the present disclosure, when used, may achieve the blanket and selective implantation with one ion beam or one pass of the ion beam to generate two regions simultaneously or substantially simultaneously. In addition, the technique does not require two different masks. Further, additional steps of placing different masks, processing with different masks, and removing the masks may be avoided. The technique described in the present disclosure is much more simple and efficient.

Figure 6:
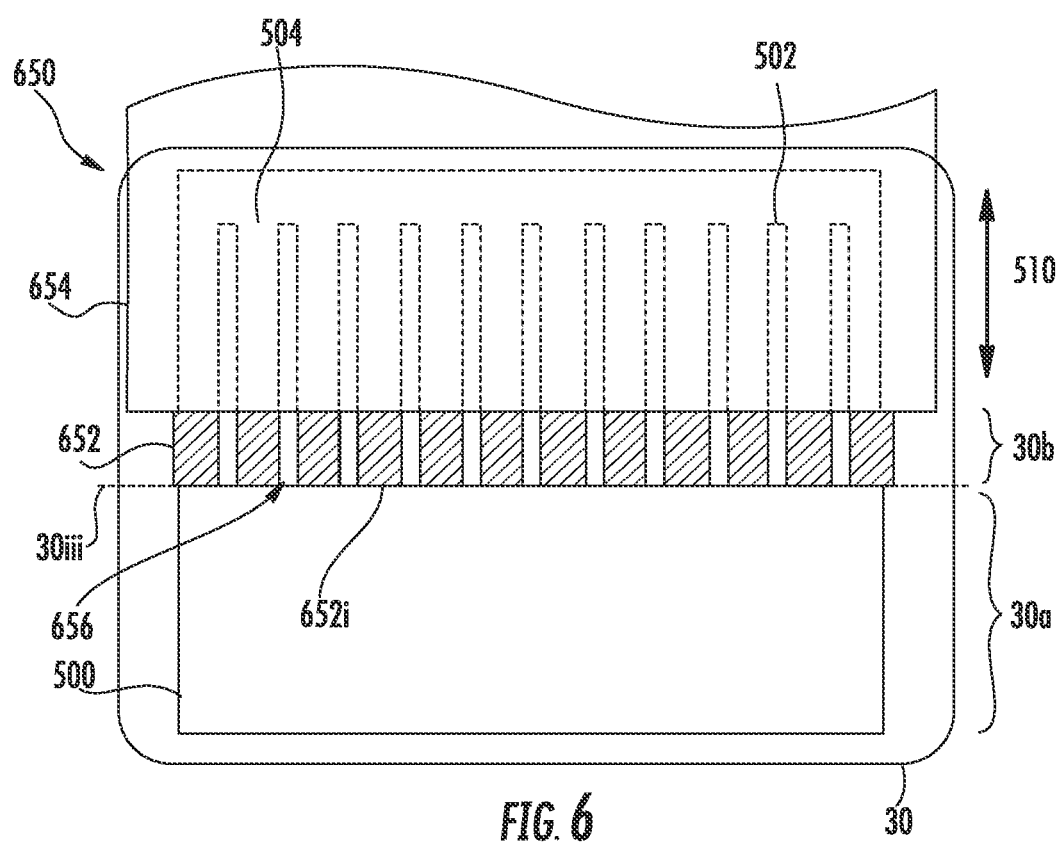
FIG. 6 illustrates illustrate another exemplary technique for processing a substrate according to one embodiment of the present disclosure.

Referring to FIG. 6, there is shown another exemplary technique for processing a substrate according to one embodiment of the present disclosure. The figures are not necessarily drawn to scale. Those of ordinary skill in the art will recognize that the present embodiment contains many features that are similar to those described in the earlier embodiments. For the purposes of clarity and simplicity, description of similar features may not be repeated. The features are not necessarily drawn to scale.

In the present embodiment, the substrate 500 and the mask 650 may be disposed in an ion implantation system. Thereafter, the ion beam 30 may be directed toward the substrate 400. In the present embodiment, the height of the ion beam 30, along the direction shown by arrow 510, may be sufficiently large such that translation of the substrate 400 relative to the ion beam 30 may be unnecessary. In other words, the height of the ion beam 30 is sufficiently large such that the region in the substrate 500 to be implanted may be encompassed by the height of the ion beam 30, and the substrate 500 or the ion beam 30 need not be translated relative to the other.

The mask 550 of the present embodiment, meanwhile, may be similar to the mask 350. Similar to the earlier embodiment, each of the ion beam 30, the mask 550, and the substrate 500 of the present embodiment may have independent rotational and translational freedom. However, the substrate 500 and the ion beam 30 may be fixedly positioned relative to one another such that they may tilt, rotate, and/or translate jointly. Meanwhile, the mask 550 may translate relative to the ion beam 30 and the substrate 500. As the mask 550 translates along the height direction, the highly doped first region 502 and the lightly doped second region 504 may be formed. To prevent additional implantation of the dopants into the first and second regions 502 and 504, the mask 650 of the present embodiment may optionally include a base 654 with a greater height. Performing the technique of the present embodiment, the highly doped first region 502 and the lightly doped second region 504 may be achieved by translating the mask 650 relative to the ion beam 30.

Figure 7:
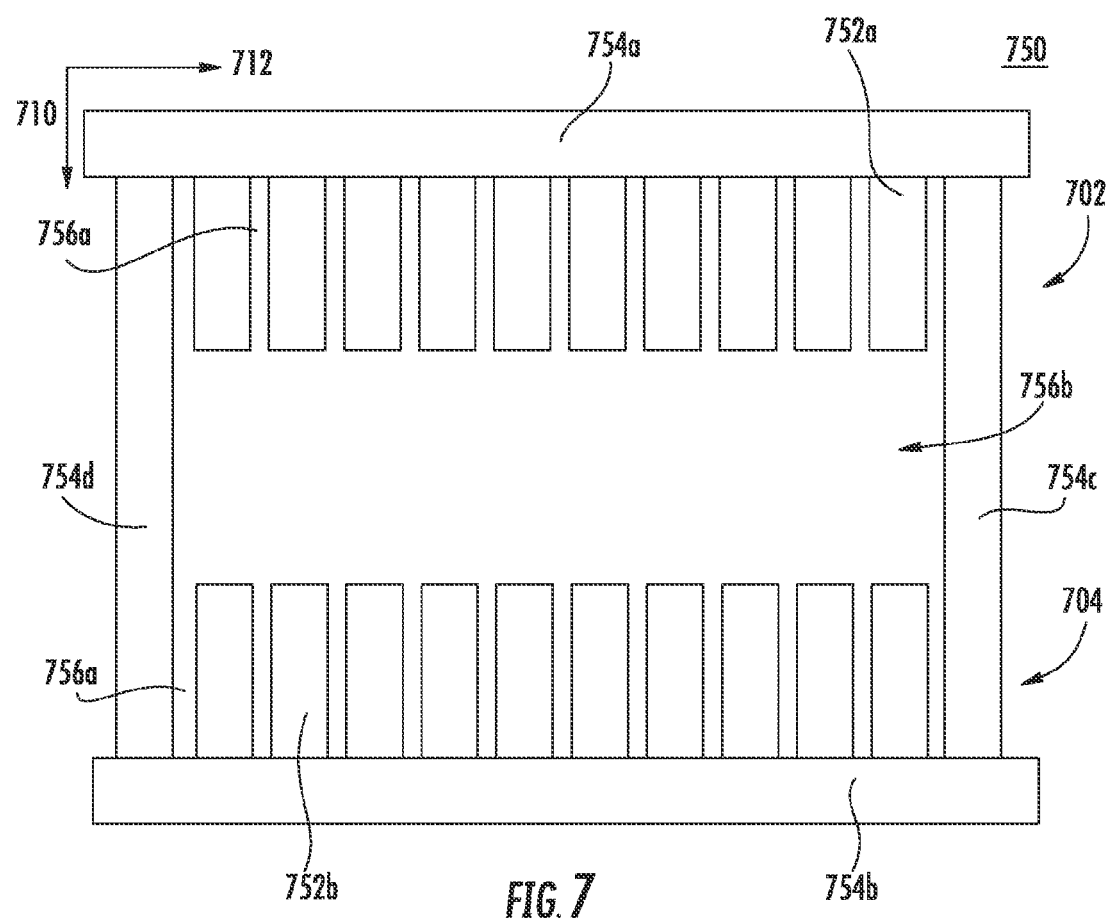
FIG. 7 illustrates another exemplary mask for processing a substrate according to another embodiment of the present disclosure.

Referring to FIG. 7, there is shown another exemplary mask 750 according to another embodiment of the present disclosure. In the present embodiment, the mask 750 may comprise upper and lower parts 702 and 704 disposed at opposite sides of the mask 750. Those of ordinary skill in the art will recognize that each of the upper and lower parts 702 and 704 is similar to the mask 350 of the earlier embodiment illustrated in FIG. 3. In each of the upper and lower parts 702 and 704, the mask 750 may comprise one or more first finger 752a and one or more second finger 752b. The mask 750 may also comprise optional first and second bases 754a and 754b supporting the first and second fingers 752a and 752b. In addition, the mask 750 may also include optional third and fourth bases 754c and 754d disposed next to the fingers, at opposite sides.

If each of the upper and lower part 702 and 704 of the mask 750 comprises two or more first and second fingers 752a and 752b, the fingers 752a and 752b may be spaced apart from one another, along the width direction 712, to define one or more first aperture 756a. The mask 750 may also comprise a second aperture 756b defined by the upper and lower parts 702 and 704 being spaced apart from one another along the height direction 710.

Similar to the masks 350 and 450 of earlier embodiments, the mask 750 of the present embodiment may include various materials.

Figure 8A:
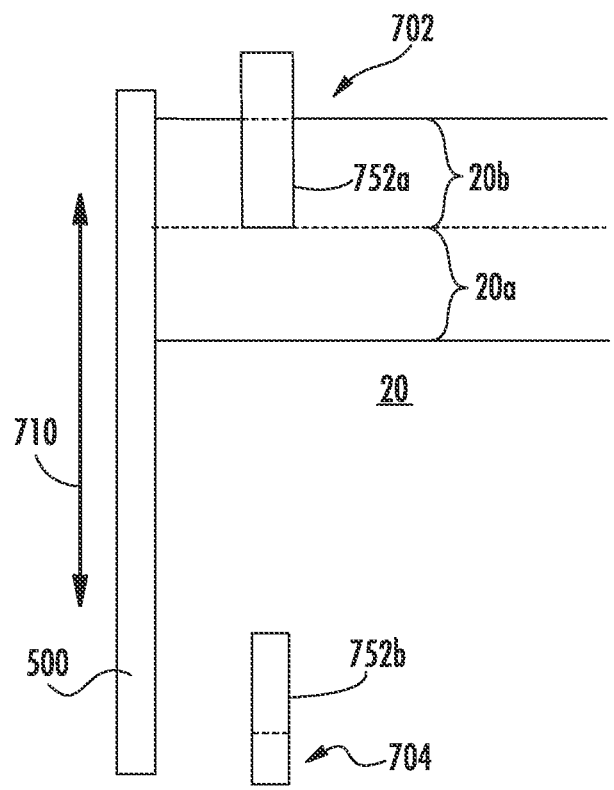
FIGS. 8a and 8b illustrate another exemplary technique for processing a substrate according to another embodiment of the present disclosure.
Figure 8B:
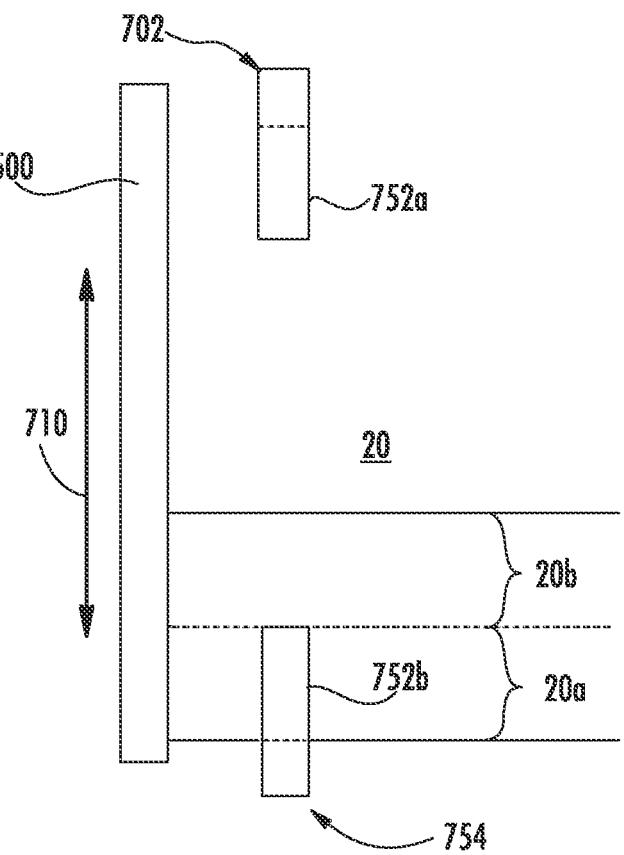

Referring to FIGS. 8a and 8b, there is shown another exemplary technique for processing a substrate according to another embodiment of the present disclosure. The figures are not necessarily drawn to scale. For the purposes of clarity and simplicity, the technique of the present embodiment will be described with the mask 750 illustrated in FIG. 7. Those of ordinary skill in the art will recognize that the present technique may be performed with other masks. In addition, for the purposes of clarity and simplicity, the third and fourth optional bases 754c and 754d are not shown.

The technique of the present embodiment may be a multi-part technique, where the first part may be similar to the technique described with FIGS. 5a and 5b. As such, the technique of the present embodiment should be read with the technique of the earlier embodiment described with FIGS. 5a and 5b.

In the present embodiment, the mask 750 may be disposed between the ion source (not shown) and the substrate 500. Thereafter, the ion beam 20 may be directed to the substrate 500 along the ion beam path. During the first part of the technique, the ion beam 20 may be directed to upper part 702 of the mask 750, and the upper part 702 of the mask 750 may be disposed in the ion beam path. As illustrated in FIG. 8a, the first fingers 752a may be dimensioned or positioned such that the first fingers 752a do not extend through the entire height of the ion beam 20. In the process, the ion beam 20 may be divided into the first and second parts 20a and 20b. The ions in the first part 20a of the ion beam 20 may be implanted directly into the substrate via the second aperture 756b so as to perform blanket ion implantation. Meanwhile, a portion of the ions from the second part 20b of the ion beam 20 may pass through one or more first apertures 756a to perform selective ion implantation. Similar to the technique disclosed in FIGS. 5a and 5b, the substrate 500 may translate along the height direction 710. Meanwhile, the upper part 702 of the mask 750 may be fixedly positioned with the ion beam 20. As a result, highly doped regions (not shown) and lightly doped regions (not shown) may be formed on the substrate 500.

During the second part of the technique, which may occur after or prior to the first part, the ion beam 20 may be directed to the lower part 704 of the mask 750. Similar to the first part of the technique, the second fingers 752a may be dimensioned or positioned such that the second fingers 752a do not extend through the entire height of the ion beam 20. In the process, the ion beam 20 may be divided into the first and second part 20a and 20b. Unlike the first part of the technique, the first part of the ion beam 20a may used to perform selective ion implantation via the first apertures 756a in the lower part 704 of the mask 750. Meanwhile, blanket ion implantation may be performed with the second part 20b of the ion beam 20a.

The technique of the present embodiment provides several advantages. Among others, the technique may be used to address non-uniformity of the ion beam 20 along the height direction 710. In many ion implanters, non-uniformity such as, for example, ion dose variation may exist along the height direction. The variation may be caused by, among others, space-charge effect. By using both the first and second parts of the ion beam to generate the highly doped and lightly doped regions, the non-uniformity may be mitigated.

In addition, the position of the mask 750 with respect to the substrate may be determined. For example, the mask 750 may be disposed upstream of the substrate 500 without calibrating the relative position of the first and second fingers 752a and 752b with respect to the substrate 500 and the ion beam 20. The ion beam 20 may be directed toward the mask 750, and based on the loss of ion beam current due to the fingers 752a and 752b, the "wafer map" may be generated. In addition, the rate which the ion beam or the substrate scans along the height direction 710 may be adjusted to compensate for any asymmetry. For example, the mask 750 may be moved relative to the ion beam while the substrate 500 is being turned around, when the substrate 500 is not being ion implanted. This may allow non-uniformities in the ion beam to cancel out in the blanket-implanted portion of the substrate. The mask 750 need not be moved every time the substrate is being turned around, but may be moved at intervals that minimize the overlap with ion beam fluctuations. For example, this may avoid harmonics of 50 and 60 Hz.

Figure 9:
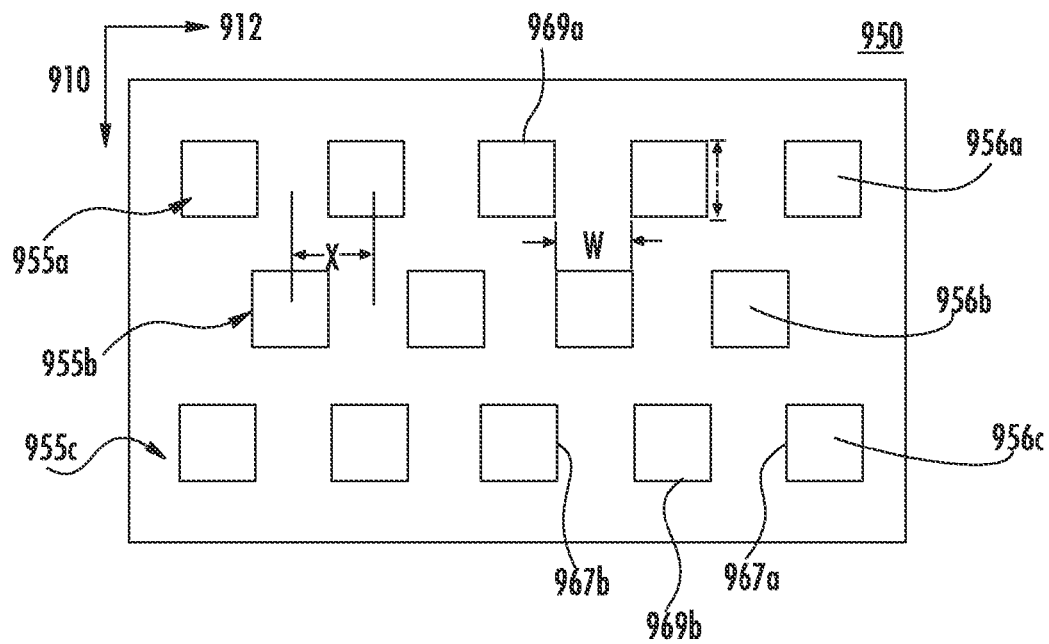
FIG. 9 illustrates another exemplary mask for processing a substrate according to another embodiment of the present disclosure.

Referring to FIG. 9, there is shown another exemplary mask 950 according to another embodiment of the present disclosure. For the purposes of clarity and simplicity, the mask 950 may be described in context to apertures. The mask 950 may comprise a plurality of rows 955a-955c of apertures 956a-956c along the height direction 910. In the present embodiment, the mask 850 may comprise three rows 955a-955c. On each row 955a-955c, one or more apertures 956a-956c may be disposed. The apertures 956a-956c, in the present embodiment, may be rectangularly shaped. As illustrated in FIG. 9, each aperture 956a-956c of the present embodiment may comprise first and second sides 967a and 967b extending along the height direction 910 by a distance 1 and first and second widths 969a and 969b extending along the width direction 912 by a distance w. In other embodiments, the apertures 956a-956c may have other shapes.

In the present embodiment, the apertures 956a-956c in adjacent rows 955a-955c may be non-uniform. The non-uniformity, in the present embodiment, may be associated with the position or the alignment of the apertures 956a-956c. For example, the first apertures 956a in the first row 955a and the second apertures 956b in the second row 955b are non-aligned along the height direction 910. In the process, the center of the apertures 956a and 956b may be displaced and non-aligned along the height direction 910 by a distance x.

Moreover, the apertures 956a-956c in adjacent rows 955a-955c may be positioned such that the first side 967a of the apertures 956a-956c in one row 955a-955c may be displaced and non-aligned with the first side 967a of the apertures 956a-956c in the adjacent row 955a-955c. In the present embodiment, the apertures 956a-956c in adjacent rows are displaced such that the first side 967a of the first aperture 956a is aligned with the second side 967b of the second aperture 956b. In other embodiments, the first side 967a of the first aperture 956a may be displaced and non-aligned with the second side 967b of the second aperture 956b by a distance d (not shown). In the present disclosure, the first apertures 956a may be aligned or non-aligned with the third apertures 956c in the third row 955c.

Similar to the masks of earlier embodiments, the mask 950 of the present embodiment may include various materials.

Figure 10:
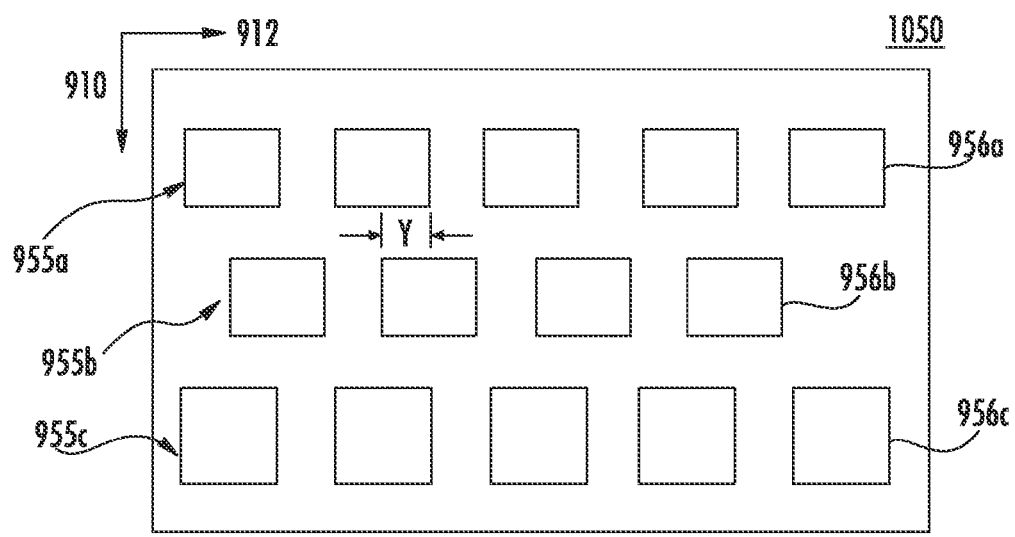
FIG. 10 illustrates another exemplary mask for processing a substrate according to another embodiment of the present disclosure.

Referring to FIG. 10, there is shown another exemplary mask 1050 according to another embodiment of the present disclosure. In the present embodiment, the mask 1050 is similar to the mask 950 shown in FIG. 9. However, the apertures 956a-956c in adjacent rows 955a-955c may overlap by a distance y, along the height direction 910.

Figure 11:
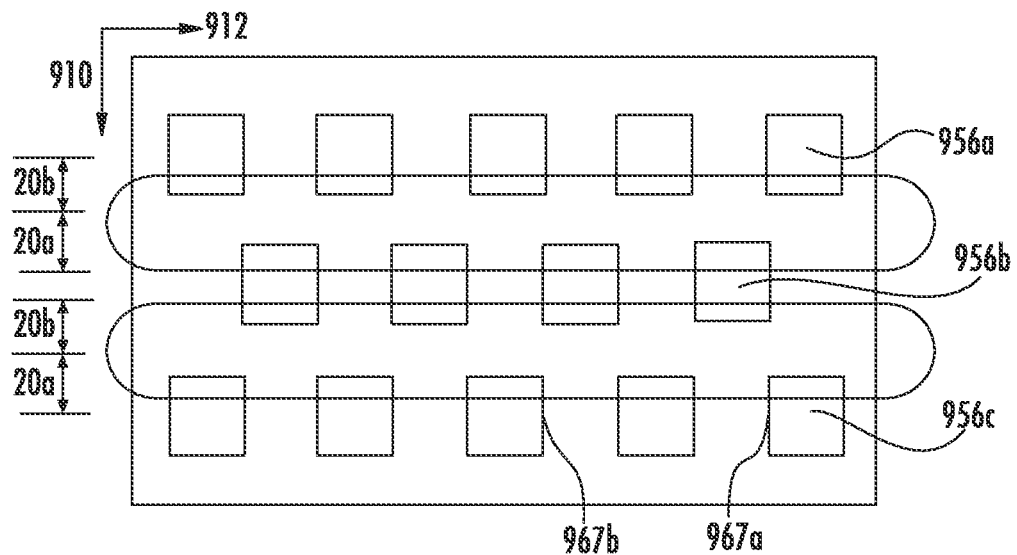
FIG. 11 illustrates another exemplary technique for processing a substrate according to another embodiment of the present disclosure.

Referring to FIG. 11, there is shown another exemplary technique for processing a substrate according to another embodiment of the present disclosure. The figure is not necessarily drawn to scale. For the purposes of clarity and simplicity, the technique of the present embodiment will be described with the mask 950 illustrated in FIG. 9. Those of ordinary skill in the art will recognize that the present technique may be performed with other masks.

The technique of the present embodiment may be a multi-part technique, where the first part may be similar to the technique described with FIGS. 5a, 5b, 8a, and 8b. As such, the technique of the present embodiment should be read with the technique of the earlier embodiment described with FIGS. 5a, 5b, 8a, and 8b.

In the present embodiment, the mask 950 may be disposed between an ion source (not shown) and the substrate (not shown). Thereafter, the ion beam 20 may be directed toward the substrate along the ion beam path. During the first part of the technique, the ion beam 20 may be directed to upper part of the mask 950. For example, the ion beam 20 and the mask 950 may be positioned such that the first part of the ion beam 20a overlaps with at least a portion of the second apertures 956b in the second row 955b. Meanwhile, the second part of the ion beam 20b may overlap with at least a portion of the first apertures 956a in the first row 955a. As the substrate translates along the height direction 910, implanted regions may form.

If the first side 967a of the first aperture 966a is aligned with the second side 967b of the second aperture 966b along the height direction 910, implant regions having a width equal to the width of the first and second apertures 956a and 956b may form. If the first side 967a of the first aperture 966a is displaced from the second side 967b of the second aperture 966b by a distance d, non-implanted regions having the width d may form between two spaced apart implant regions.

During the second part of the technique, which may occur before or after the first part, the ion beam 20 may be moved relative to the mask 950 such that the ion beam 20 is directed toward the lower part of the mask 950. For example, the ion beam 20 and the mask 950 may be positioned such that the first part of the ion beam 20a overlaps with at least a portion of the third apertures 956c in the third row 955c. Meanwhile, the second part of the ion beam 20b may overlap with at least a portion of the second apertures 956b. As the substrate translates, non-uniformity of the ion beam along the height direction 910 may be alleviated.

If the mask 1050 shown in FIG. 10 is used, the overlapping of the first and second apertures 956a and 956b or overlapping of the second and third apertures 956b and 956c may enable formation of highly doped regions, having width y, between light doped regions. The heavily doped regions may form by ions passing through the overlapping regions, whereas the lightly doped regions may form by ions passing through the non-overlapping regions. Further, if the technique is a multi-part process, the non-uniformity along the height direction of the beam (not shown) may be alleviated.

Figure 12:
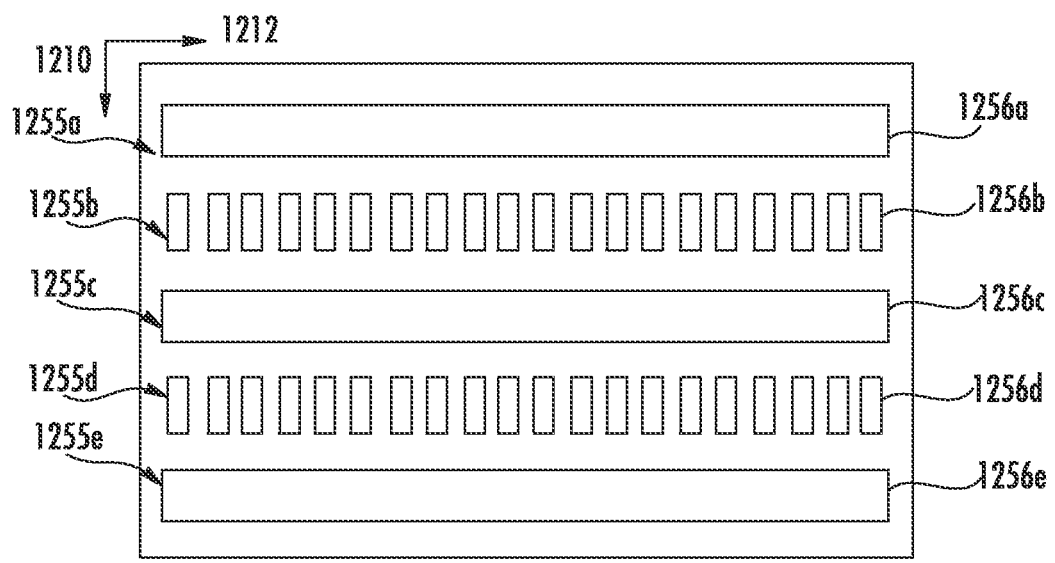
FIG. 12 illustrates another mask for processing a substrate according to another embodiment of the present disclosure.

Referring to FIG. 12, there is shown another exemplary mask according to another embodiment of the present disclosure. The mask 1250 may comprise a plurality of rows, each of which containing one or more apertures. In the present embodiment, the mask 1250 may comprises 5 rows 1255a-1255e, and one or more apertures 1256a-1256e may be disposed on each rows. As illustrated in FIG. 10, the apertures 1056a-1056e in adjacent rows are non-uniform. For example, the apertures 1056a-1056c in adjacent rows may differ with respect to the size and position.

Similar to the masks of earlier embodiments, the mask 1050 of the present embodiment may include various materials.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for implanting ions into a substrate, the apparatus comprising:
   an ion source for generating an ion beam comprising a plurality of ions of desired species, wherein the ion beam comprises a ribbon ion beam or a scanned spot or focused ion beam, having a longer dimension along a width direction, the ion beam directed toward the substrate, wherein the ion beam comprises a first part and a second part, each part extending in the width direction, where the first part of the ion beam is disposed proximate the second part in a height direction that is perpendicular to the width direction;
   a mask disposed between the ion source and the substrate, the mask comprising:
      one or more first apertures disposed in a first row; and
      one or more second apertures disposed in a second row, each row extending along the width direction, wherein the one or more first apertures and the one or more second apertures are non-uniform;
   wherein one of the substrate and the mask is configured to translate relative to the other one of the substrate and the mask in the height direction while the first part of the ion beam overlaps at least a portion of the one or more first apertures and the second part of the ion beam overlaps at least a portion of the one or more second apertures, such that differently doped regions are created in the substrate by the ion beam passing through the first apertures and the ion beam passing through the second apertures and wherein the ion beam is fixedly positioned to the mask during the relative translating.

2. The apparatus according to claim 1, wherein the one or more first apertures and the one or more second apertures have different sizes.

3. The apparatus according to claim 1, wherein the one or more first apertures and the one or more second apertures have non-uniform alignment along a height direction of the mask.

4. The apparatus according to claim 3, wherein the one or more first apertures and the one or more second apertures overlap along the height direction to define an overlapping region.

5. The apparatus according to claim 3, wherein the one or more first apertures and the one or more second apertures are without an overlapping region along the height direction.

6. The apparatus according to claim 1, wherein the mask further comprises:
   one or more third apertures disposed in a third row, wherein the one or more second apertures and the one or more third apertures are in a non-aligned relationship with one another along a height direction of the mask.

7. The apparatus according to claim 6, wherein the one of the substrate and the mask is configured to translate relative to the other one of the substrate and the mask while a first part of the ion beam overlaps at least a portion of the one or more second apertures and a second part of the ion beam overlaps at least a portion of the one or more third apertures.

* * * * *